United States Patent [19]

Moksvold et al.

[11] Patent Number: 5,387,553
[45] Date of Patent: Feb. 7, 1995

[54] METHOD FOR FORMING A LATERAL BIPOLAR TRANSISTOR WITH DUAL COLLECTOR, CIRCULAR SYMMETRY AND COMPOSITE STRUCTURE

[75] Inventors: Tor W. Moksvold, Poughkeepsie, N.Y.; John Altieri; Ching-Tzuen Tarn, both of San Jose, Calif.; Colleen M. Snavely, Manassas, Va.

[73] Assignee: International Business Machines Corporation, Armonk, N.Y.

[21] Appl. No.: 276,222

[22] Filed: Jul. 15, 1994

Related U.S. Application Data

[62] Division of Ser. No. 856,433, Mar. 24, 1992.

[51] Int. Cl.⁶ .......................................... H01L 21/265
[52] U.S. Cl. ................................... 437/32; 437/150; 437/154; 437/917; 148/DIG. 96
[58] Field of Search .................. 437/31, 32, 150, 154, 437/917; 148/DIG. 9, DIG. 10, DIG. 96

[56] References Cited

U.S. PATENT DOCUMENTS

| | | | |
|---|---|---|---|
| 3,766,446 | 10/1973 | Tarui et al. | 437/32 |
| 4,263,066 | 4/1981 | Kolmann | 437/154 |
| 4,319,257 | 3/1982 | Beasom | 437/154 |
| 4,966,858 | 10/1990 | Masquelier et al. | 437/917 |
| 5,064,774 | 11/1991 | Pfiester | 437/150 |
| 5,208,169 | 5/1993 | Shah et al. | 437/31 |

FOREIGN PATENT DOCUMENTS 3259533  11/1991  Japan ................................. 437/917

Primary Examiner—Brian E. Hearn
Assistant Examiner—Tuan Nguyen
Attorney, Agent, or Firm—Harold Huberfeld

[57] ABSTRACT

A lateral PNP bipolar transistor includes concentric circular emitter and annular base and dual collector regions. The inner collector region is moderately doped to provide good punch-through and Early voltage performance. The outer collector region is highly doped to provide low collector series resistance. A composite transistor made up of any desired number of individual transistors provides a transistor having a desired current capacity. The transistor annular base cross-section permits very accurate base width control during the manufacturing process.

6 Claims, 4 Drawing Sheets

METHOD FOR FORMING A LATERAL BIPOLAR TRANSISTOR WITH DUAL COLLECTOR, CIRCULAR SYMMETRY AND COMPOSITE STRUCTURE

This is a divisional application of U.S. patent application Ser. No. 07/856,433 filed Mar. 24, 1992.

BACKGROUND OF THE INVENTION

1. Field of the Invention

This invention relates generally to integrated semiconductor devices and more particularly to lateral bipolar transistors and a method of manufacturing such transistors.

2. Related Art

U.S. Pat. No. 4,180,827 to Harlan R. Gates and assigned to the assignee of the present invention, describes a double diffused, lateral PNP bipolar transistor having an emitter 62, a base 36 and a collector 44. In such transistor designs the emitter and base have a rectangular cross-section. The inventors have discovered that this rectangular geometric relationship for the emitter and base of a lateral PNP transistor results in certain adverse effects on the performance and breakdown voltages of the transistor. The emitter and base in such a device are self-aligned since they are both defined by the same mask shape. The base width in such a device is established by the lateral diffusion of the emitter and the base. In emitter and base regions having a rectangular cross-section, the dopant distribution is not uniform over the entire region. Dopant concentration tends to be different at the corners when compared to the sides of the rectangle and in the case of non square rectangles, dopant concentration tends to be different on the short and long sides of the rectangle. Such differences in dopant concentration produce a transistor having a variable base width thereby creating corresponding undesirable variations in breakdown voltages and other transistor characteristics. Exacerbating this problem is the fact that regions having a rectangular cross-section tend to have rounded corners of uncontrolled radius as a result of diffraction and certain other process variables.

The inventors have further recognized that there are inherent conflicting performance consequences that result from the collector doping level selected for a double diffused PNP bipolar transistor of the type described in U.S. Pat. No. 4,180,827. A relatively low level of collector doping has the beneficial effects of providing adequate punch-through and Early voltage performance and a low base/collector junction capacitance. A relatively high level of collector doping has the beneficial effect of providing a low collector series resistance. Thus the selection of any particular collector doping level will compromise one or both of these sets of parameters.

In addition, the inventors have recognized a need for a lateral PNP bipolar transistor whose voltage and current capacities and frequency response may be easily tailored to desired levels.

SUMMARY OF THE INVENTION

Accordingly, an object of the present invention is the provision of a lateral bipolar transistor having a clearly defined constant base width.

Another object of the present invention is the provision of a lateral bipolar transistor having a collector which provides good punch-through and Early voltage performance, a low base/collector junction capacitance, and also a low series resistance.

A further object of the present invention is the provision of a lateral bipolar transistor whose voltage and current capacities may be easily tailored to desired levels.

A still further object of the present invention is the provision of a lateral bipolar transistor having significantly improved frequency response.

Yet another object of the present invention is the provision of a relatively simple and inexpensive method of making a lateral PNP bipolar transistor which is complementary to making an NPN transistor.

Thus, a lateral bipolar transistor is described which includes a substrate having a semiconductor portion of a first conductivity type and an epitaxial semiconductor later of a second conductivity type supported thereon. A plurality of regions are formed between the outer surface of the epitaxial layer and the substrate, with all of the regions being symmetrical about a common axis. The first such region is an emitter region of the first conductivity type including a portion having a substantially circular cross-section centered about the axis. A second such region is a base region of the second conductivity type surrounding the emitter region. The base region includes a portion having a substantially annular cross-section defined by inner and outer boundaries centered about the axis with the inner boundary being in contact with the emitter region. Another such region is a first collector region of the first conductivity type surrounding the base region and having a first dopant concentration. The first collector region includes a portion having a substantially annular cross-section defined by inner and outer boundaries centered about the axis with the first collector region inner boundary being in contact with the base region outer boundary. Yet another such region is a second collector region of the first conductivity type surrounding the first collector region and having a second dopant concentration substantially higher than the first dopant concentration. The second collector region includes a portion having an inner boundary with a substantially circular cross-section centered about the axis, with the second collector region inner boundary being in contact with the first collector region outer boundary.

A plurality of such lateral bipolar transistors may be formed into a composite lateral bipolar transistor structure having integral electrical interconnections between respective emitter, base and collector regions of each transistor, thus forming a composite transistor structure having the electrical characteristics of a single transistor.

A method of making a lateral bipolar transistor is provided and includes forming a mask with an opening on the epitaxial layer and doping the epitaxial layer with a first dopant material of the first conductivity type through the opening to form a first doped region of the first conductivity type. An oxide layer is then formed on the epitaxial layer and a circular opening located substantially over the center of the first doped region is formed in the oxide layer. The first doped region is doped with a second dopant material, of the second conductivity type, through the circular opening to form a second doped region, of the second conductivity type within the first doped region. The second doped region is doped with the first dopant material through the circular opening to form a third doped region, of the first conductivity type, within the second doped region. An annular opening concentric with the second and third doped regions is formed in the oxide layer, thereby exposing the outer surface of the first doped region. The first doped region is doped with the first dopant material through the annular opening to form a fourth doped region, of the first conductivity type, within the first doped region, concentric with and spaced from the second doped region and having a dopant concentration substantially higher than the dopant concentration of the first doped region.

Other objects, advantages, and novel features of the present invention will become apparent from the following detailed description of the invention when considered in conjunction with the accompanying drawings.

DESCRIPTION OF THE PREFERRED EMBODIMENTS

Figure 1A:
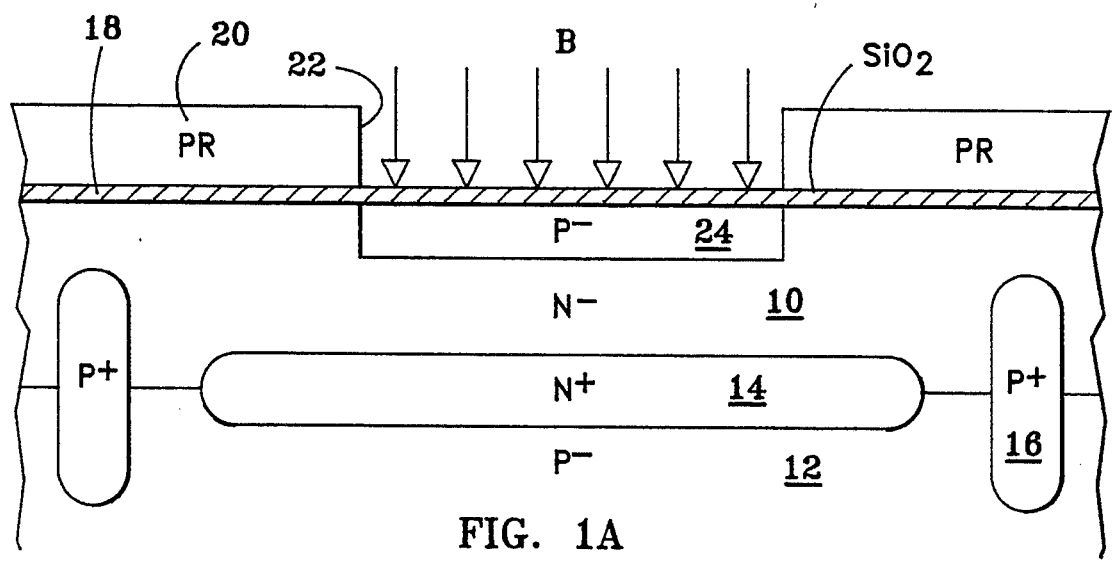
FIGS. 1A–1F show, in schematic form, the process steps used in making the lateral bipolar transistor of the present invention.

Referring to FIGS. 1A–1F, the process of the present invention follows known masking, doping and deposition techniques to grow an epitaxial layer 10 on a substrate 12 and form buried regions 14 and 16 therebetween. The doping of these regions is preferably P− for substrate 12, N− for epitaxial layer 10, N+ for buried layer 14, and P+ for buried layer 16. As used herein the symbol "−" means lightly doped, having a dopant concentration in the range of $10^{14}$–$10^{16}$, and the symbol "+" means heavily doped, having a dopant concentration in the range of $10^{18}$–$10^{19}$. A screen oxide layer 18, preferably of SiO2 having a thickness of approximately 225Å is formed on the outer surface of epitaxial layer 10. The screen oxide layer 18 is formed in preparation for the doping of regions in the layer 10 by ion implantation. Should diffusion be chosen as the method of doping the layer 10, then, as is well known in the art, the formation of a screen oxide layer is omitted. A mask 20 of photoresist material is then formed on the oxide layer 18. An opening 22 is formed in the mask 20 by known photolithography techniques. The shape of the opening 22 is not critical but is preferably square. Epitaxial layer 10 is then doped with Boron to a resistivity of approximately 4000 Ohms/square by ion implantation of specie Boron 11, at an energy of 180 KeV and a dose of 6.5 E12, through opening 22 to form P− region 24. The photoresist layer 20 and the screen oxide layer 18 are then removed.

Figure 1B:
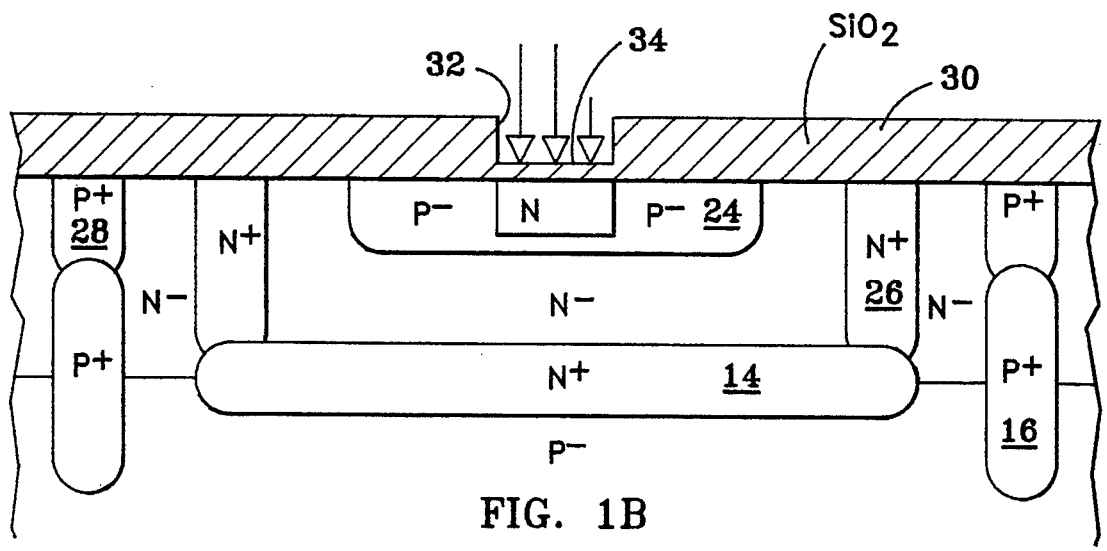

As shown in FIG. 1B, reach-through N+ region 26 is then formed to connect with buried region 14 and reach-through P+ region 28 is formed to connect with buried region 16. A thick oxide layer 30, preferably of SiO2 and having a thickness of approximately 5000Å, is formed on the outer surface of epitaxial layer 10, P− region 24, N+ region 26 and P+ region 28. As will become apparent from the subsequent description of the present invention, a particularly novel feature of the present invention is the formation of a circular opening 32 in oxide layer 30 located substantially over the geometric center of P− region 24. The opening 32 is formed by known etch techniques and may either be formed all the way to the outer surface of P− region 24, for a subsequent diffusion step, or to a slightly lesser depth to leave a thin screen oxide layer 34, for a subsequent ion implantation step. Phosphorous is then implanted through the opening 32 and the screen oxide layer 34 with the thick oxide layer 30 serving as an implant stop, to form an N region 36 within P− region 24. N region 36 is preferably formed by implanting specie P31 at an energy of 80 KeV and a dose of 1.6E15, resulting in a resistivity of approximately 40 Ohms/square.

Figure 1C:
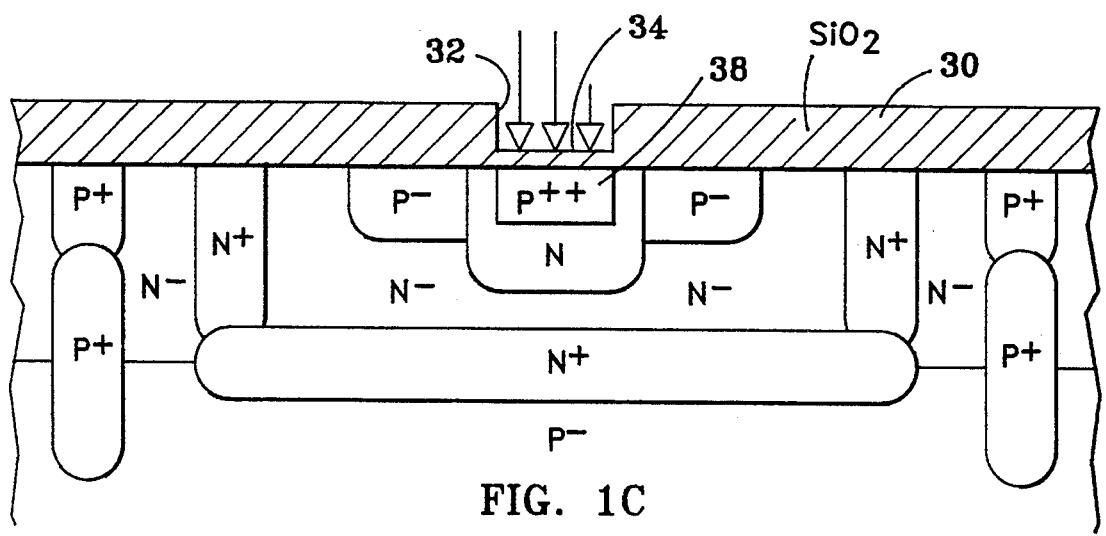
Figure 1D:
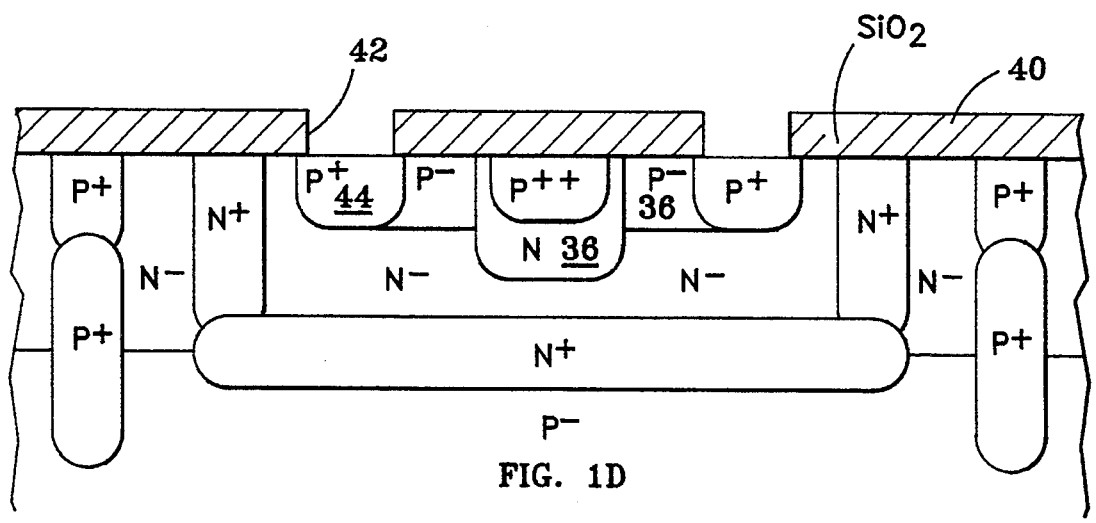

As is shown in FIG. 1C, Boron is then implanted through opening 32 and screen oxide layer 34 to form a P++ region 38 within N region 36. P++ region 38 is preferably formed by implanting specie B11 at an energy of 45 KeV and a dose of 1.6E15. As will also become apparent from the subsequent description of the present invention, another particularly important feature of the present invention, as shown in FIG. 1D, is the formation by known etch techniques of an annular opening 42 in oxide layer 30. The annular opening 42 is concentric with the regions 36 and 38 and exposes the radially outermost portion of the outer surface of region 24. Boron is then diffused into the region 24 through opening 42 creating a P+ region 44 within region 24 which is concentric with and spaced from the region 36. Any highly doped Boron diffusion or implant process may be utilized to form the region 44. However, for process simplicity, an NPN base diffusion process is used. An open tube deposition of BBR3 is performed at 875° C. for 47 minutes to form a region having a resistivity of 400 Ohms/square. Portions of oxide layer 30 are then removed in a known manner. The resultant structure is then subjected to a drive-in anneal and a reoxidation process at 925° C. for 90 minutes to ad an oxide thickness of 1800Å.

Figure 1E:
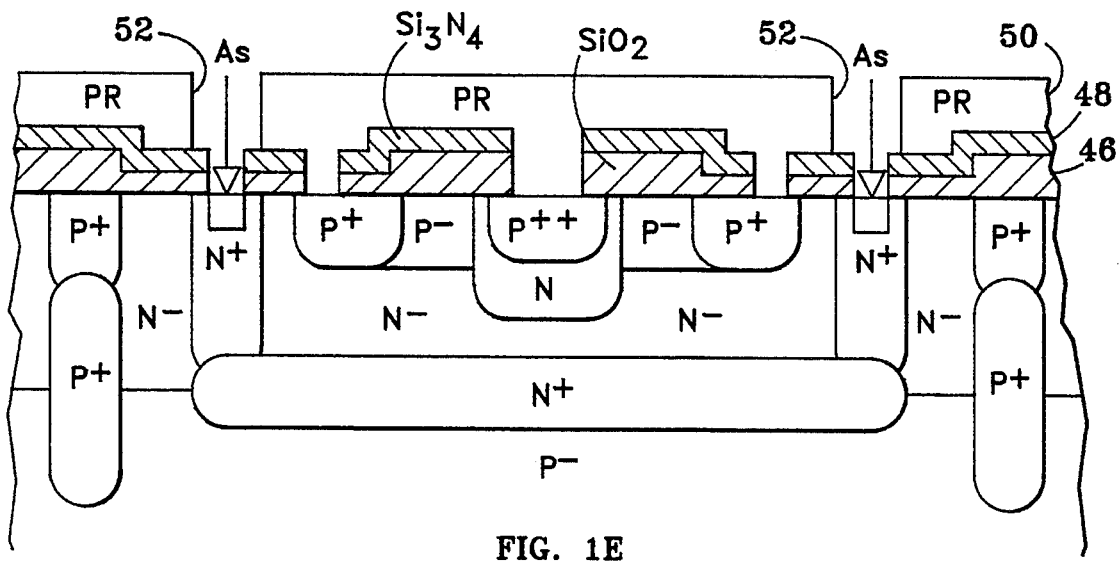

As shown in FIG. 1E, the oxide layer 40 is then removed, a new SiO2 layer 46, a Si3N4 layer 48, and a layer of photoresist 50 are formed on the outer surface of the epitaxial layer 10 and all regions contained therein in a known manner. Openings 52 are then formed in the layers 46, 48, and 50 and Arsenic is implanted through openings 52 to form N++ regions 54 for good ohmic contact at the surface of reach-through region 26. The finished device is then annealed at a temperature of 1000° C. and metal contacts are added in a known manner. Contact 56 is in contact with region 38, contact 58 in contact with region 44, and contacts 60 in contact with regions 54, as shown in FIG. 1F.

Figure 1F:
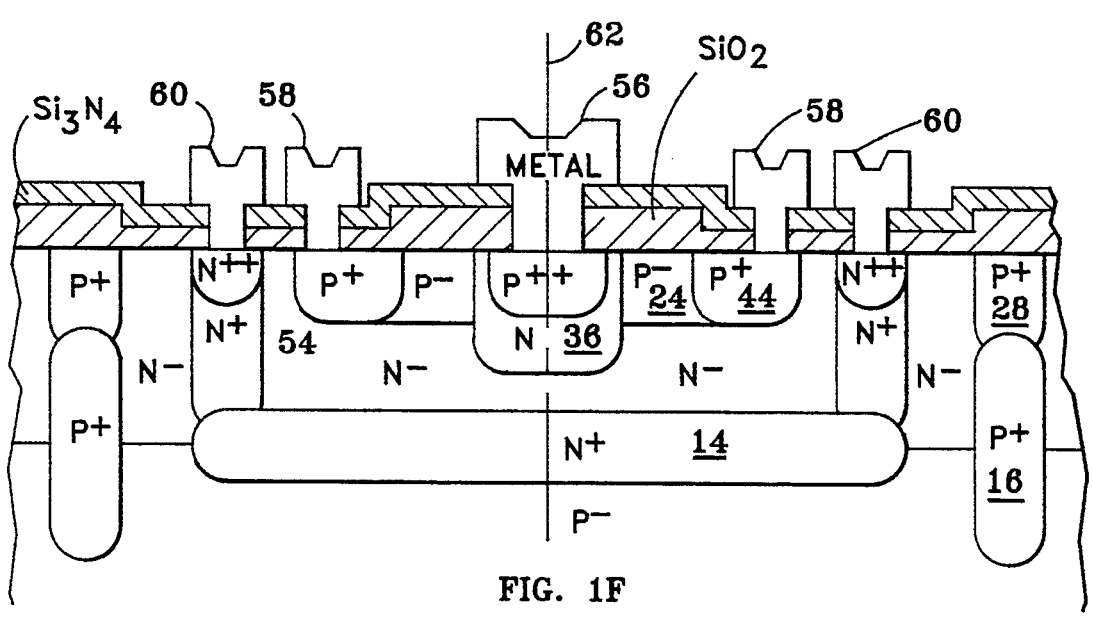
Figure 2:
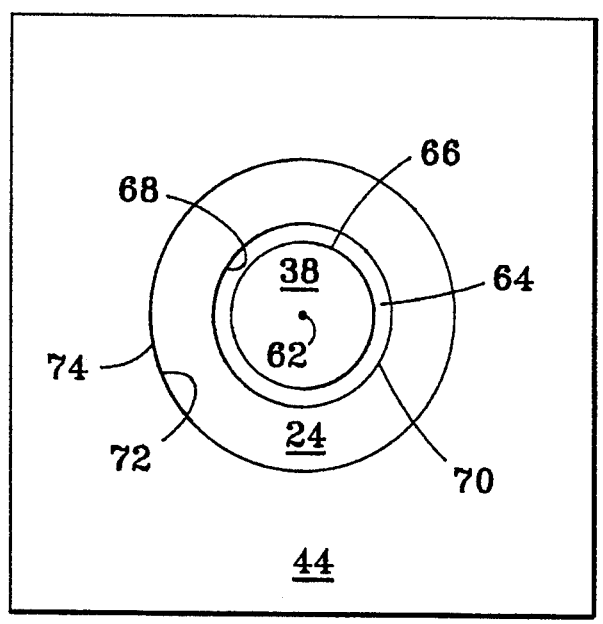
FIG. 2 shows, in schematic form, a partial top view of the lateral bipolar transistor shown in FIG. 1F.

Thus as is shown in FIG. 1F, the lateral bipolar transistor of the present invention includes a P− substrate 12 and an N− type epitaxial layer 10 supported by the substrate 12. As is also shown in FIG. 2, regions 38, 36, 24 and 44 are contained within layer 10 between its outer surface and the substrate 12 with all of the regions 38, 36, 24 and 44 being symmetrical about a common axis 62. The P++ emitter region 38 has a circular cross-section centered about the axis 62. The N type base region 36 surrounds the emitter region 38 and includes a portion 64 having a substantially annular cross-section defined by an inner boundary 66 and an outer boundary 68 centered about the axis 62, with the inner boundary 66 contacting the radially outer wall of the emitter region 38. A P− collector region 24 surrounds the base region 36 and has a substantially annular cross-section defined by an inner boundary 70 and an outer boundary 72 centered about the axis 62, with the inner boundary 70 contacting the outer boundary 68 of base region 36. A P+ collector region 44, having a much higher dopant concentration than the collector region 24, surrounds the region 24. The region 44 has an inner boundary 74 having a substantially circular cross-section centered about the axis 62, with the inner boundary 74 contacting the outer boundary 72 of collector region 24. A buried N+ base region 14 contacts the base region 36 and is in contact with reach-through N+ and N++ base regions 26 and 54, respectively. P+ regions 16 and 28 provide isolation. The transistor is provided with emitter contact 56, collector contact 58 and base contacts 60.

The low dopant concentration in collector region 24 serves to provide good Early and punch-through voltage performance and a low base/collector junction capacitance. The relatively high dopant concentration in collector region 44 serves to lower overall collector series resistance. Furthermore the circular symmetry of the emitter, base and collector provides a uniform base width in the submicron range which provides improved transistor performance. The concentric annular design of the portion 64 of base region 36 permits very accurate control of the base width, the difference in the radii of boundaries 66 and 68. Furthermore, the process of the present invention is complementary to the formation of an NPN transistor on the substrate 12, similar to that described in U.S. Pat. No. 4,180,827.

Figure 3:
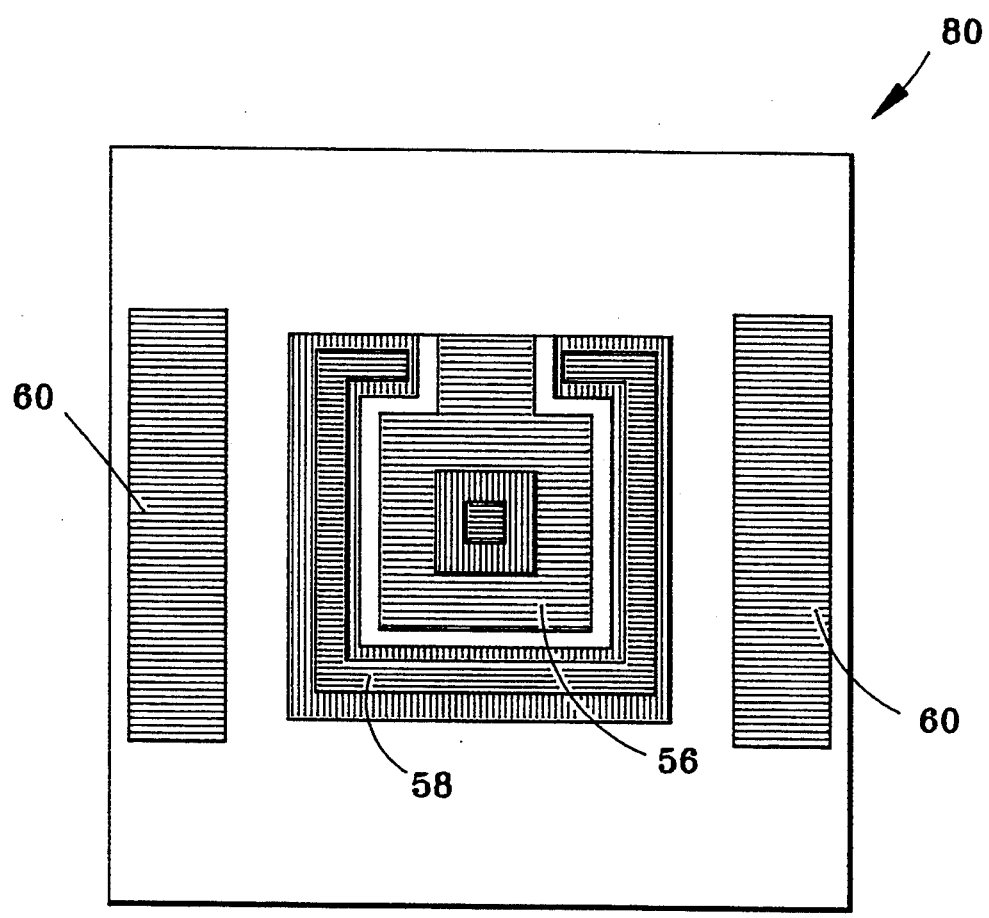
FIG. 3 shows a top view of a single lateral bipolar transistor of the present invention.
Figure 4:
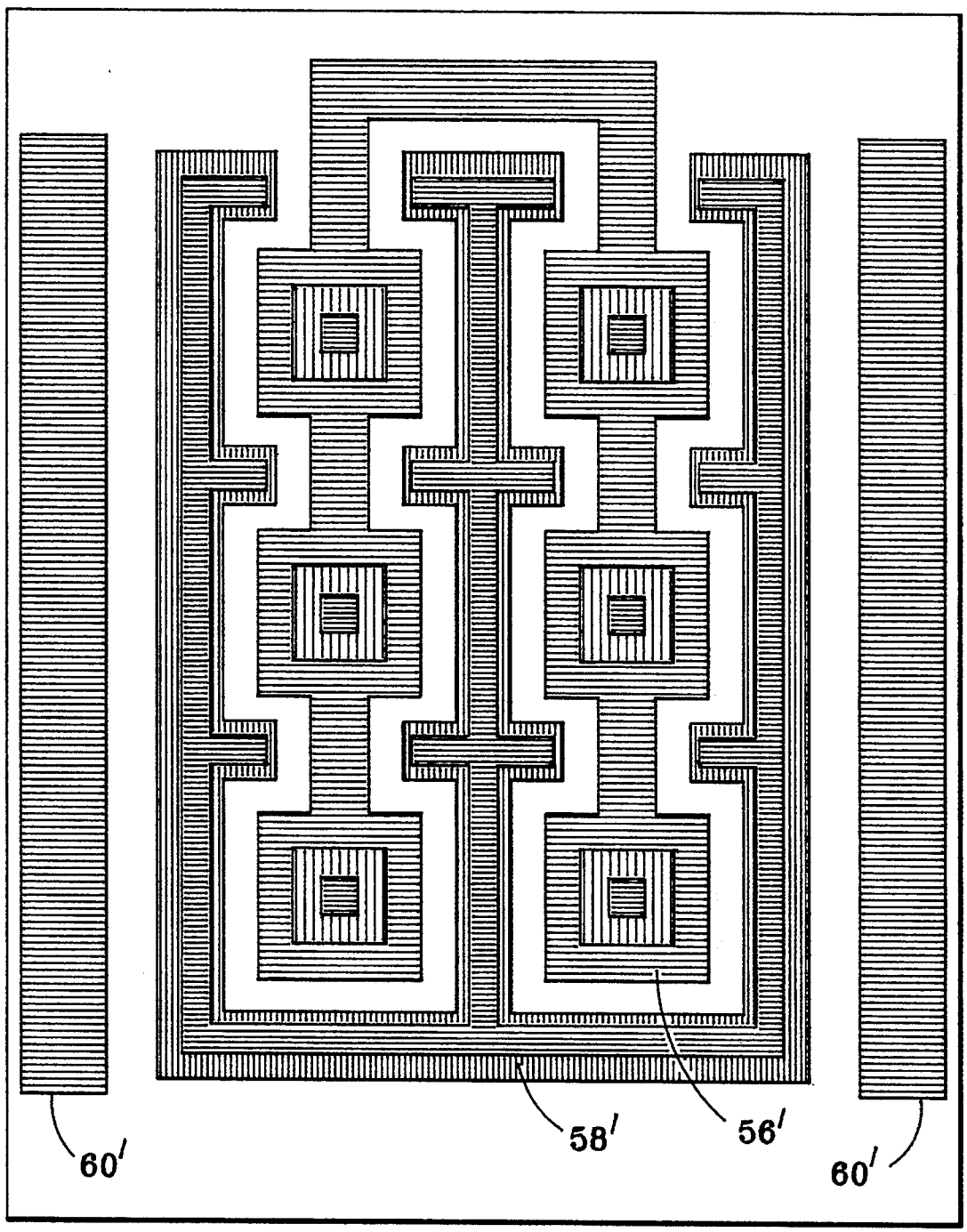
FIG. 4 shows a top view of a composite lateral bipolar transistor of the present invention.

As shown in FIG. 3, each transistor 80 of the present invention may be formed as a unit device having an emitter contact 56, base contacts 60 and a collector contact 58. To meet the particular current requirements of any particular industrial application, any number of individual transistors 80 of equal voltage rating and frequency response may be combined into a composite lateral bipolar transistor as shown in FIG. 4. Thus each of the individual emitter contacts 56, base contacts 60 and collector contacts 58 are interconnected to form emitter contact 56', base contact 60' and collector contact 58', respectively. The contacts 56', 60' and 58' serve to interconnect the unit devices in a substantially coplanar fashion resulting in a simple and cost effective interconnect pattern.

Each transistor 80 is a lateral transistor having a parasitic diode (horizontal junction of emitter 38 and base 36) in the vertical direction. To minimize the effects of this parasitic diode, it is desirable to have a high perimeter to area ratio for the emitter. For the circular emitter 38 this ratio is 2/r, where r is the radius of the emitter 38. Thus, transistor efficiency increases as the radius r decreases. The composite transistor design of the present invention avoids the necessity to increase emitter size to obtain increased transistor output current capacity. The circumference to area ratio for multiple emitters remains 2/r regardless of the number of individual transistors in a particular composite transistor design of the present invention, thus yielding the desired high transistor efficiency, by keeping r small.

While there has been described what is at present considered to be the preferred embodiment of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. A method of making a lateral bipolar transistor comprising:
    providing a substrate including a semiconductor portion of a first conductivity type;
    growing an epitaxial semiconductor layer of a second conductivity type on said substrate, said epitaxial layer having an outer surface;
    forming a mask having an opening therein on said epitaxial layer;
    doping said epitaxial layer with a first dopant material, of said first conductivity type, through said opening to form a first doped region, of said first conductivity type;
    forming an oxide layer on said epitaxial layer;
    forming a circular opening in said oxide layer located substantially over the center of said first doped region;
    doping said first doped region with a second dopant material, of said second conductivity type, through said circular opening to form a second doped region, of said second conductivity type, within said first doped region;
    doping said second doped region with said first dopant material through said circular opening to form a third doped region, of said first conductivity type, within said second doped region;
    forming an annular opening in said oxide layer concentric with said second and third doped regions and thereby exposing the outer surface of said first doped region; and
    doping said first doped region with said first dopant material through said annular opening to form a fourth doped region, of said first conductivity type, within said first doped region, concentric with and spaced from said second doped region and having a dopant concentration substantially higher than the dopant concentration of said first doped region.

2. A method of making a transistor as set forth in claim 1 wherein said first conductivity type is P type and said second conductivity type is N type.

3. A method of making a transistor as set forth in claim 1 further including:
    forming a buried region of said second conductivity type between said substrate and said epitaxial layer; and
    forming a reach-through region of said second conductivity type extending from said outer surface of said epitaxial layer to said buried layer.

4. A method of making a transistor as set forth in claim 3 further including forming electrical contacts on exposed surfaces of said reach-through region, said third doped region, and said fourth region.

5. A method of making a transistor as set forth in claim 1 wherein said first dopant material is Boron and said second dopant material is Phosphorous.

6. A method of making a transistor as set forth in claim 1 further including, before forming said mask, oxidizing said epitaxial layer to form a thin screen oxide layer on said outer surface, and wherein said epitaxial layer is doped with said first dopant material by ion implantation through said thin screen oxide layer, wherein said oxide layer is formed over said thin screen oxide layer, wherein said first doped region is doped with said second dopant material by ion implantation through said circular opening and said thin screen oxide layer, and wherein said second doped region is doped with said first dopant material by ion implantation through said circular opening and said thin screen oxide layer.

* * * * *